US005572168A

United States Patent [19]
Kasturia

[11] Patent Number: 5,572,168
[45] Date of Patent: Nov. 5, 1996

[54] FREQUENCY SYNTHESIZER HAVING DUAL PHASE LOCKED LOOPS

[75] Inventor: Sanjay Kasturia, Middletown, N.J.

[73] Assignee: Lucent Technologies Inc., Murray Hill, N.J.

[21] Appl. No.: 513,195

[22] Filed: Aug. 9, 1995

[51] Int. Cl.$^6$ .................. H03L 7/07; H03L 7/16
[52] U.S. Cl. .................. 331/2; 331/1 A; 331/16; 331/18; 327/107; 327/147; 327/150; 455/260
[58] Field of Search .................. 331/1 A, 2, 16, 331/17, 18, 25; 327/105, 107, 147–150, 156–159; 455/260

[56] References Cited

U.S. PATENT DOCUMENTS

| | | | |
|---|---|---|---|
| 4,380,743 | 4/1983 | Underhill et al. | 331/1 A |
| 4,599,579 | 7/1986 | McCann | 331/1 R |
| 5,337,005 | 8/1994 | Fenk et al. | 331/2 X |
| 5,361,044 | 11/1994 | Norimatu et al. | 331/1 A |
| 5,422,604 | 6/1995 | Jokura | 331/2 |

Primary Examiner—David Mis

[57] ABSTRACT

A frequency synthesizer circuit for the front end of an RF system. The frequency synthesizer uses two pulse-swallow phase-locked loops in a synthesizer architecture that produces an output frequency that is a function of the two reference frequencies used as inputs into the two phase-locked loops. As a result, the frequency synthesizer can be incremented in steps equal to the differential of the reference frequencies of the two phase-locked loops, while the frequency outputs of each of the phase-locked loops can be incremented in much larger steps. This enables the two phase-locked loops to employ relatively large bandwidths, thereby achieving a faster signal lock as well as a better suppression of the voltage controlled oscillator (VCO) phase noise in each loop. The use of a dual loop synthesizer architecture allows for feedback correction of the VCO phase noise outside the loop bandwidth.

24 Claims, 5 Drawing Sheets

FREQUENCY SYNTHESIZER HAVING DUAL PHASE LOCKED LOOPS

BACKGROUND OF THE INVENTION

1. Field of the Invention

The present invention relates to frequency synthesizers used in the front end of an RF receiver system. More particularly, the present invention relates to frequency synthesizer circuits for use in frequency-hopped spread-spectrum systems that use a dual phase-locked loop architecture to provide feedback control for VCO phase noise in increments that are not directly dependent upon the loop bandwidth of either of the phase-locked loops used within the synthesizer.

2. Prior Art Statement

As RF systems become more sophisticated and are applied to a wider range of applications, the need increases for RF systems that are economical to produce and yet are applicable to complex spread-spectrum applications. Frequency synthesizers are widely used in RF front end systems. For sophisticated applications, the output of the frequency synthesizer must satisfy stringent performance requirements, wherein the frequency synthesizer must be able to generate a large number of closely-spaced channels. For example, the Groupe Speciale Mobile (GSM) RF system, which acts as a mobile telephone standard in Europe, requires 124 channels to be generated with a 200 kHz spacing. In a more complex IS54 mobile telephone application, 800 channels are required with only a 30 kHz spacing. Furthermore, in addition to generating distinct closely spaced channels, a frequency synthesizer must be able to exhibit a relatively fast lock when switching from one channel to another.

Many conventional frequency synthesizers employ a single pulse-swallow frequency divider within a phase-locked loop, in order to obtain precise channel selection in the output frequency. Such prior art systems are exemplified by U.S. Pat. No. 4,380,743 to Underhill et al., entitled FREQUENCY SYNTHESIZER OF THE PHASE LOCK LOOP TYPE; U.S. Pat. No. 4,599,579 to McCann, entitled FREQUENCY SYNTHESIZER HAVING JITTER COMPENSATION; and U.S. Pat. No. 5,361,044 to Norimatu et al., entitled PHASE LOCKED LOOP FREQUENCY SYNTHESIZER. The use of such single loop synthesizer configurations has the advantage of exhibiting small side bands at the output of the voltage controlled oscillator. Another advantage is that such synthesizer configurations are relatively low in complexity.

A disadvantage of such conventional single loop frequency synthesizers is that the lock time of the loop tends to be quite long. This makes conventional single loop frequency synthesizers a poor selection for high performance applications such the frequency-hopped spread-spectrum systems used in sophisticated mobile telephone applications. A more critical disadvantage of such conventional frequency synthesizers is that the feedback within such a single loop circuit is incapable of correcting the phase noise of the voltage controlled oscillator outside the loop bandwidth. This disadvantage is most prevalent in monolithic implementations because integrated oscillators typically do not incorporated passive resonators and therefore produce large phase noise.

It is therefore an object of the present invention to provide a frequency synthesizer circuit that utilizes monolithic integration in mainstream VLSI technologies wherein the frequency synthesizer is capable of correcting the phase noise of the voltage controlled oscillator outside the loop bandwidth.

It is a further objective of the present invention to provide a frequency synthesizer circuit with improved lock time between distinct channels, thereby enabling the circuit to be more readily adapted to high frequency-hopped spread-spectrum applications.

SUMMARY OF THE INVENTION

The present invention is a frequency synthesizer circuit for the front end of an RF system. The frequency synthesizer uses two pulse-swallow phase-locked loops in a synthesizer architecture that produces an output frequency that is a function of the two reference frequencies used within the two phase-locked loops. As a result, the frequency synthesizer can be incremented in steps equal to the differential of the reference frequencies of the two phase-locked loops, while the frequency outputs of each of the phase-locked loops can be incremented in much larger steps. This enables the two phase-locked loops to employ relatively large bandwidths, thereby achieving a faster signal lock as well as a better suppression of the voltage controlled oscillator (VCO) phase noise in each loop. The use of a dual loop synthesizer architecture allows for feedback correction of the VCO phase noise outside the loop bandwidth. The improved suppression of the phase noise from the voltage controlled oscillator enables the frequency synthesizer to be manufactures using monolithic implementations, wherein in the prior art integrated oscillators would suffer from large phase noise due to the lack of passive resonators in the integrated scheme.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE PREFERRED EMBODIMENT

Although the present invention frequency synthesizer can be used in any application where a circuit is expected to achieve a low phase noise with a fast lock acquisition, such as Up-conversion mixing in an RF system transmission path, the present invention is especially suited for use in the front end of an RF receiver system. Accordingly, the present invention frequency synthesizer will be described in an RF front end system. More specifically, the present invention frequency synthesizer will be described as part of the front end of a Groupe Speciale Mobile (GSM) RF system, which is a European mobile telephone standard that operates with 124 channels with 200 kHz spacings. Such an application is merely exemplary and is intended to represent the best mode contemplated for the invention.

Figure 1:
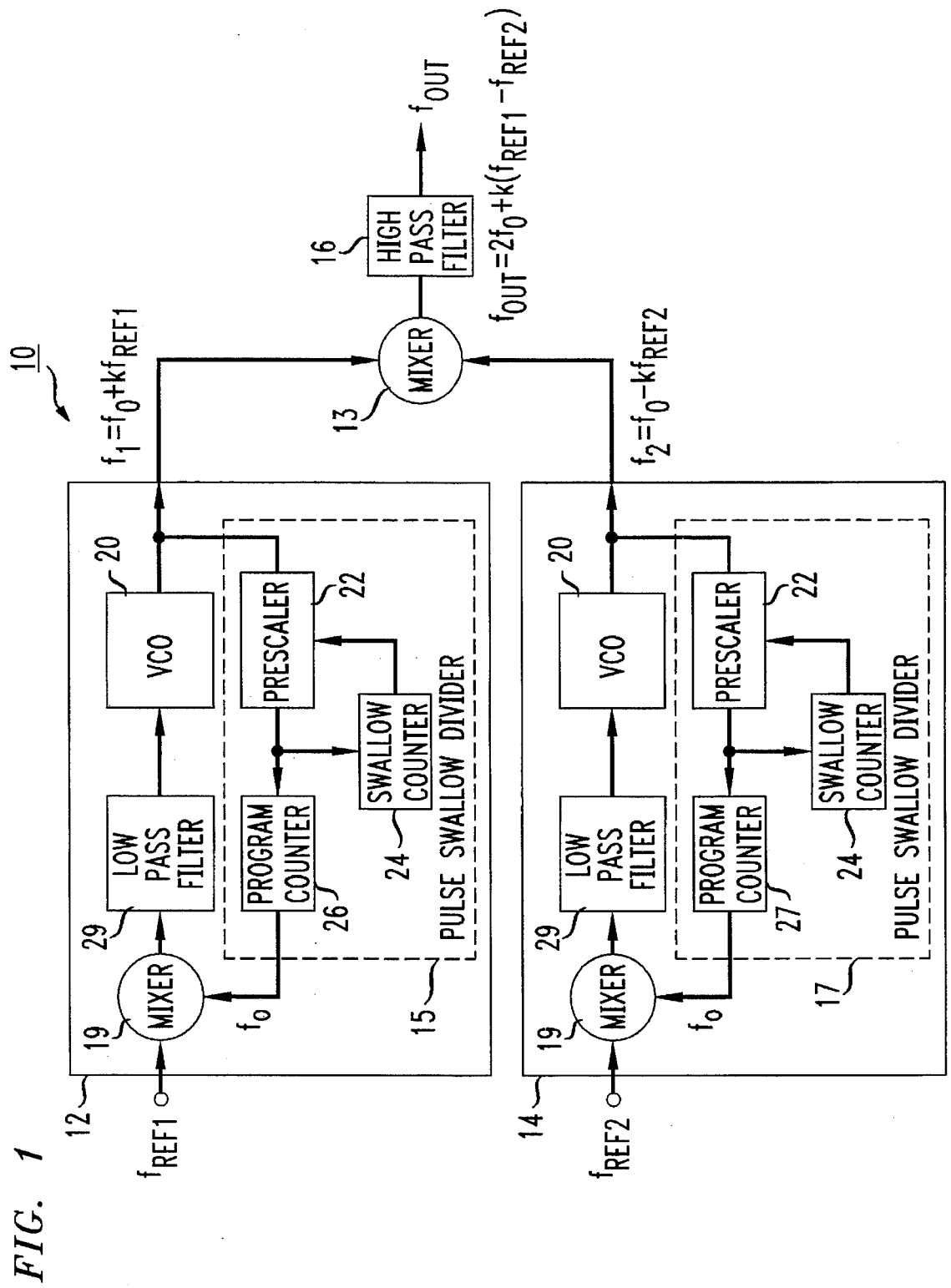
FIG. 1 is a block diagram schematic illustrating a preferred embodiment of the present invention frequency synthesizer.

Referring to FIG. 1, a preferred embodiment of the present invention frequency synthesizer 10 is illustrated. As will be further explained, the frequency synthesizer 10 is capable of being manufactured as an integrated circuit utilizing mainstream VLSI technologies such as 0.6 µm CMOS integration. The use of monolithic integration provides for low power dissipation and relatively low costs associated with manufacturing.

The frequency synthesizer 10 utilizes a dual-loop architecture that includes two pulse-swallow phase-locked loops 12, 14. Each of the two pulse-swallow phase-locked loops, 12, 14 includes a low pass filter 29, a voltage controlled oscillator (VCO) 20, and a feedback loop comprised of a pulse swallow divider 15, 17. The two pulse-swallow phase-locked loops 12, 14 generate outputs of $f_1 = f_0 + kf_{REF1}$ and $f_2 = f_0 - kf_{REF2}$, respectively, wherein each initial frequency $f_0$ is the respective feedback of corresponding pulse swallow divider 15, 17 and the value k is dependant upon the channel selection. A mixer 19 in each of the phase-locked loops 12, 14 mixes the corresponding feedback frequency $f_0$ of the two pulse swallow dividers 12, 14 with the appropriate reference frequency, i.e. $f_{REF1}$ or $f_{REF2}$, as part of the feedback loop. The mixing produces the stated relationship of $f_n = f_0 + f_{REFn}$. The outputs $f_1$ and $f_2$ of each of the phase-locked loops 12, 14 are then mixed, via mixer 13, and the resultant is filtered, via the high-pass filter 16, to produce an output yield equivalent to:

$$f_{OUT} = 2f_0 + k(f_{REF1} - f_{REF2})$$ [Equation 1]

As a result of the dual loop architecture, the output yield $f_{OUT}$ of the frequency synthesizer can be incremented in small steps equal to $f_{REF1} - f_{REF2}$, while output frequencies $f_1$ and $f_2$ of each individual phase-locked loop 12, 14 are incremented in much larger steps. This enables the feedback correction of phase noise of each VCR 20 outside the loop bandwidth. Such a dual loop architecture also enables the two pulse-swallow phase-locked loops 12, 14 to employ a relatively large bandwidth. The large bandwidth produces faster channel locking as well as better suppression of the phase noise from the VCO, as compared to a conventional single loop synthesizer architecture. For example, it can be seen that given $f_0 = 450$ MHz, $f_{REF1} = 1$ MHz, $f_{REF2} = 1.2$ MHz and k=124, when these values are placed within Equation 1 an output yield $f_{out}$ is equal to 900 MHz–Kx200kHz. It should be noted that in practice, it is necessary to allow a spacing of a few tens of megahertz between the minimum value of $f_1$ and the maximum value of $f_2$ in order to ensure that intermodulation products of these frequencies fall outside the band of interest. It should also be noted that the two reference frequencies $f_{REF1}$ and $f_{REF2}$ can easily be generated by dividing a single 6 Mhz reference by six and five, respectively.

Each of the pulse swallow dividers 15, 17 used in the two phase-locked loops 12, 14 includes a dual-modulus prescaler 22, a swallow counter 24, and a program counter 26, 27. In each of the pulse swallow dividers 15, 17, the components are essentially identical, except that in the pulse swallow divider 15 of the first phase-locked loop 12, the program counter 26 has a modulus of twenty while the program counter 27 of the second phase-locked loop has a modulus of thirty.

Figure 2:
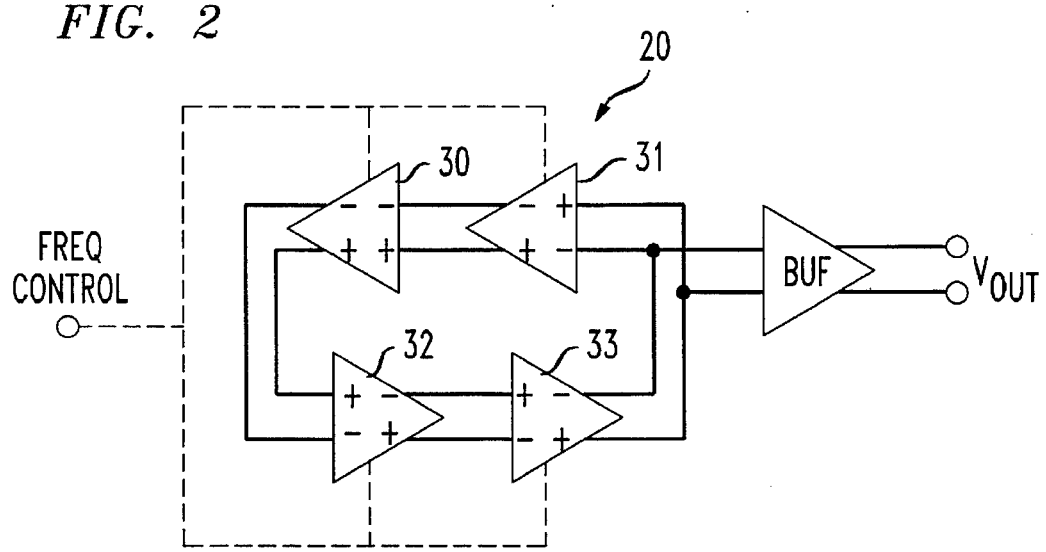
FIG. 2 is a block diagram schematic showing a preferred embodiment of the voltage controlled oscillator (VCO) used in the present invention frequency synthesizer.

The VCO 20 in each of the pulse-swallow phase-locked loops 12, 14 is preferably a four-stage differential ring oscillator, thereby providing quadrature outputs. In FIG. 2, it can be seen that each stage 30, 31, 32, 33 is subject to frequency control from the feedback of the pulse-swallow phase-locked loop associated with the VCO 20. A buffer 29 is provided to buffer the combined output of all four stages.

Figure 3:
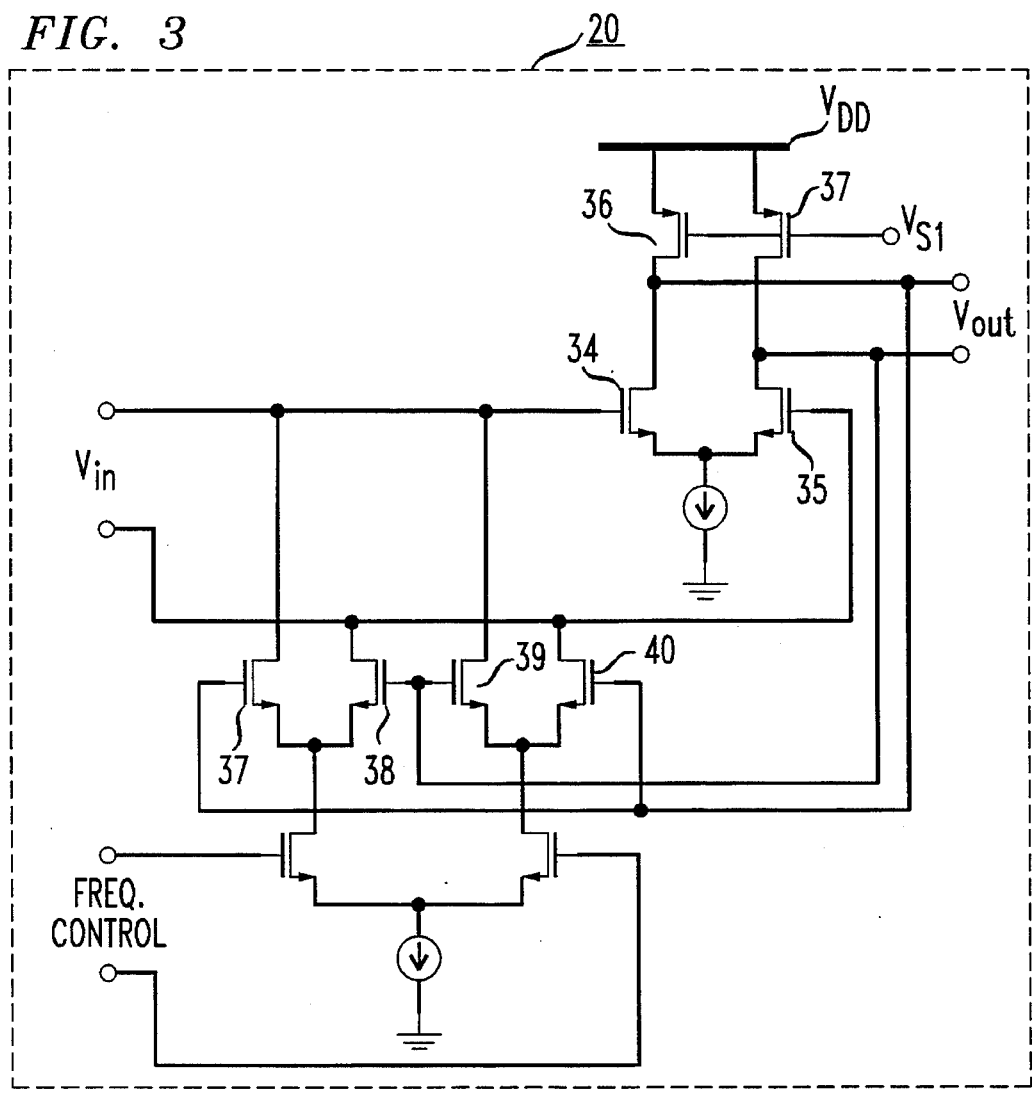
FIG. 3 is a circuit schematic of each stage of the first four stage ring oscillators shown in FIG. 2.

Referring to FIG. 3, a single stage of the first four stage VCO 20 is shown. As can be seen, each of the four stages employs an NMOS differential pair 34, 35. In the preferred embodiment, the transistors making the differential pair 34, 35 are biased at 0.75 mA. Furthermore, each transistor in the differential pair 34, 35 requires an operational voltage approximately equal to 2 volts. Each stage of the four-stage VCO 20 provides PMOS loads 36, 37 for the NMOS differential pair 34, 35 that operate in the triode region. The delay of each stage is controlled by transistors in both a second differential pair 37, 38 and a third differential pair 39, 40. The second differential pair 37, 38 and third differential pair 39, 40 provide positive and negative feedback respectively. As the feedback goes from positive to negative, the impedance experienced at each port of the VCO 20 decreases. The decrease in impedance results in an increase in oscillation within the VCO 20. To achieve low phase noise, the transistors in the first differential pair 31, 32 are preferably 100 µm wide and are biased at a tail current of 0.75 mA. Furthermore, source followers are not used within the ring oscillator to further limit phase noise.

Figure 4:
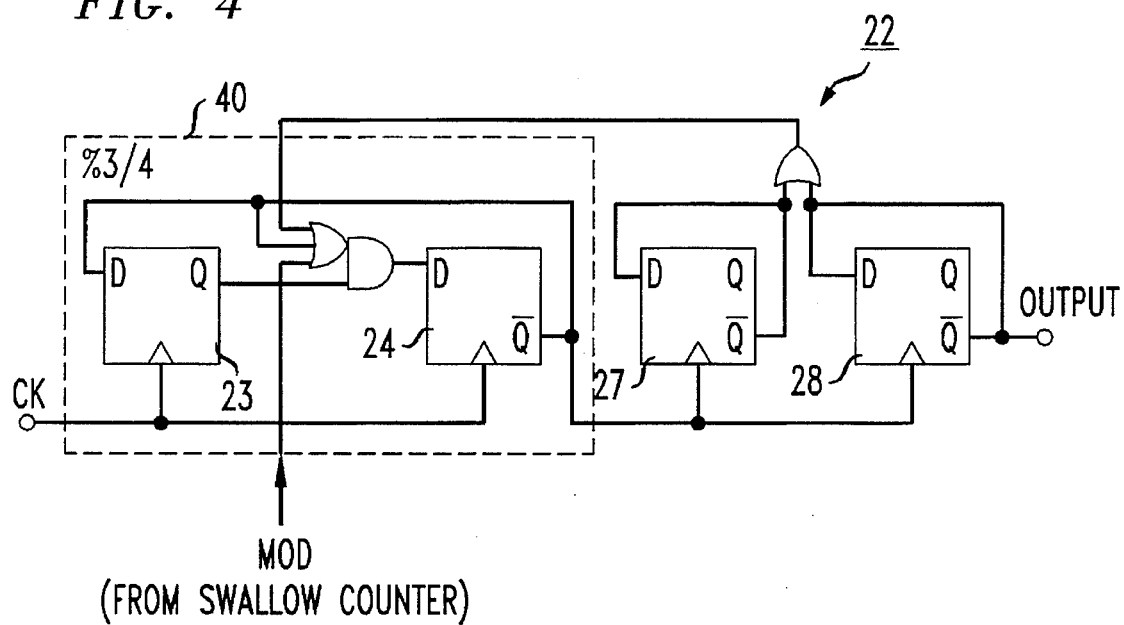
FIG. 4 is a block diagram schematic of the dual modulus prescaler used in each of the phase-locked loops within the present invention frequency synthesizer.

Referring to FIG. 4, a preferred embodiment of the dual modulus prescaler 22 is shown that is used in each of the two pulse swallow dividers 15, 17 (FIG. 1). In the preferred embodiment, the dual modulus prescaler 22 is a ÷16/÷15 prescaler. The dual modulus prescaler 22 consists of a synchronous ÷4/÷3 circuit 40 and two asynchronous ÷2 circuits. The dual modulus prescaler 22 divides the output frequency $f_1$ or $f_2$ of the associated phase-locked loop 12, 14 (FIG. 1) by sixteen when the modulus is high and by fifteen when the modulus is low. The change in modulus of the prescaler 22 is controlled by the swallow counter, as will later be explained. In the preferred embodiment, the dual modulus prescaler 22 is comprised of four identical D flip-flops 23, 25, 27, 28 to simplify layout design, wherein the first two D flip-flops 23, 25 are part of the synchronous ÷4/÷3 circuit 40 and the remaining two D flip-flops 27, 28 are part of the two asynchronous ÷2 circuits, respectively. The formation of a dual modulus prescaler using D flip-flops is well known. Accordingly an explanation of the operational logic of the shown prescaler need not be described.

Figure 5:
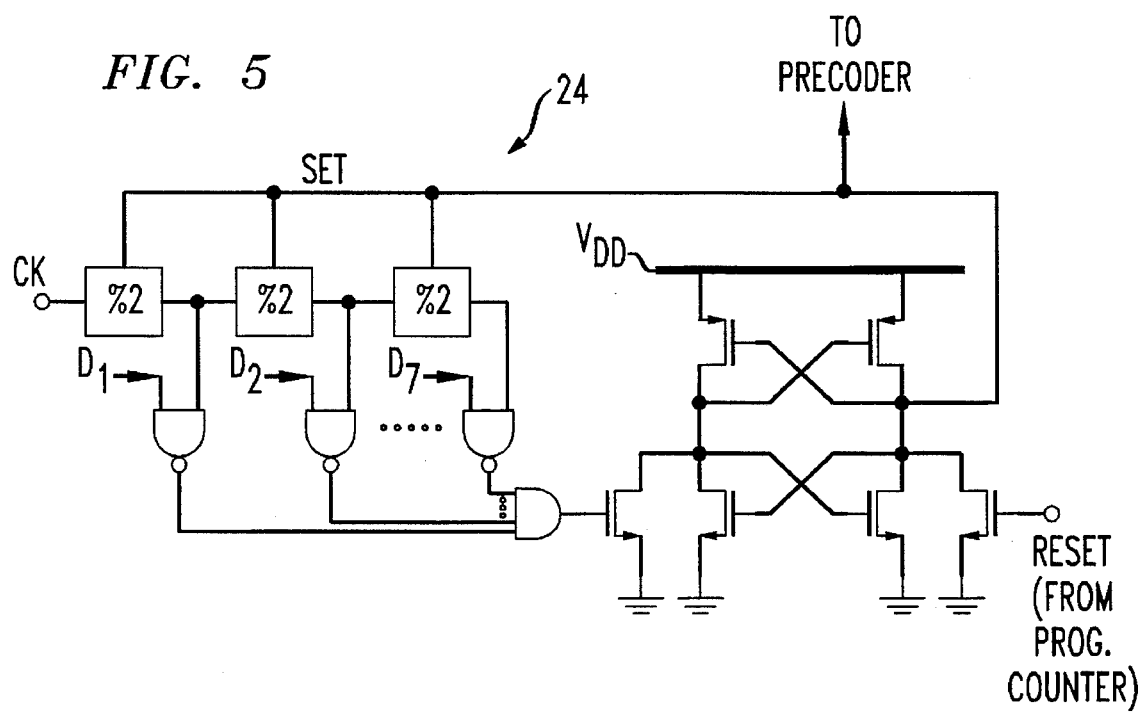
FIG. 5 is a block diagram schematic of the swallow counter used in each of the phase-locked loops within the present invention frequency synthesizer.

A swallow counter 24 is also used within each of the pulse swallow dividers 15, 17 (FIG. 1). Referring to FIG. 5, it can be seen that the preferred embodiment of the swallow counter 24 is an asynchronous programmable divider with a modulus range that depends upon the application. In the shown embodiment, the swallow counter 24 is used in a GSM system having 128 channels. As a result, the swallow counter has a modulus ranging from 1 to 128, as determined by the digital input D1 through D7. The swallow counter 24 begins with all the outputs at logic ONE and counts down until the outputs match ONE's complement of the digital input D1 through D7. When the outputs match the ONE's compliment of the digital input D1 through D7, the signal SET goes high and prevents further counting by the swallow counter 24. At this point the signal SET also changes the modulus of the prescaler 22 (FIG. 4). Swallow counters have been used in conjunction with phase-locked loops throughout the prior art. Accordingly, the operational logic of the shown swallow counter need not be set forth in detail. Similarly, any known configuration of a swallow counter could be used in the present invention in place of the exemplary configuration shown.

Figure 6:
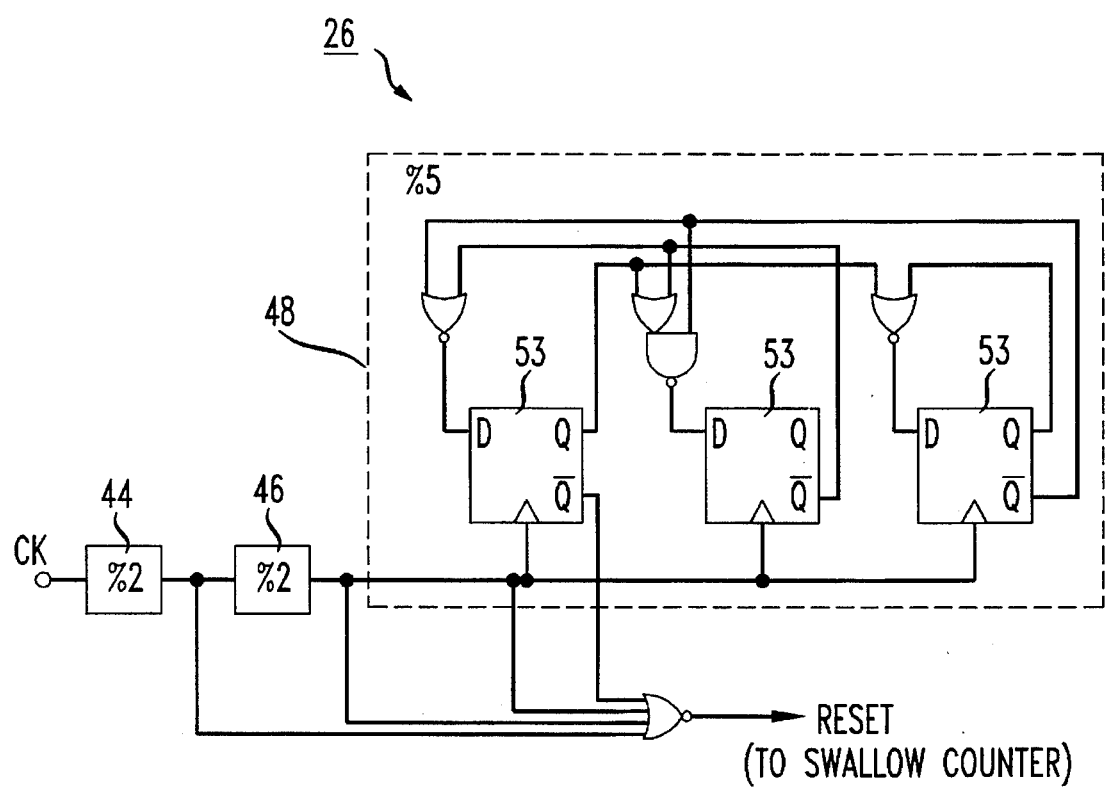
FIG. 6 is a block diagram schematic of the ÷20 program counter used in the first phase-locked loop within the present invention frequency synthesizer.

The program counter is the one component that is different between the two pulse-swallow phase-locked loops. In the first pulse-swallow phase-locked loop 12 (FIG. 1), the program counter 26 has a modulus of twenty. However, in the second pulse-swallow phase-locked loop 14 (FIG. 1), the modulus of the program counter 27 is thirty. Referring to FIG. 6, a preferred embodiment of the ÷20 modulus program counter 26 is shown wherein the desired modulus of twenty is achieved by two ÷2 circuits 44, 46 and a ÷5 circuit 48. The two ÷2 circuits 44, 46 are asynchronous while the ÷5 circuit is synchronous. The resultant circuit provides a ÷(2×2×5), which results in the desired ÷20 modulus. The preferred embodiment of the ÷5 circuit 48 contains three D flip-flops 53 of the same type used within the prescaler 22. The use of common circuit configurations simplifies manufacturing and adds to the overall low cost of the circuit. Furthermore, the manufacture of circuit components such as the prescaler and the program counter using D flip-flops is readily available using the preferred 0.6 μM CMOS techniques.

Figure 7:
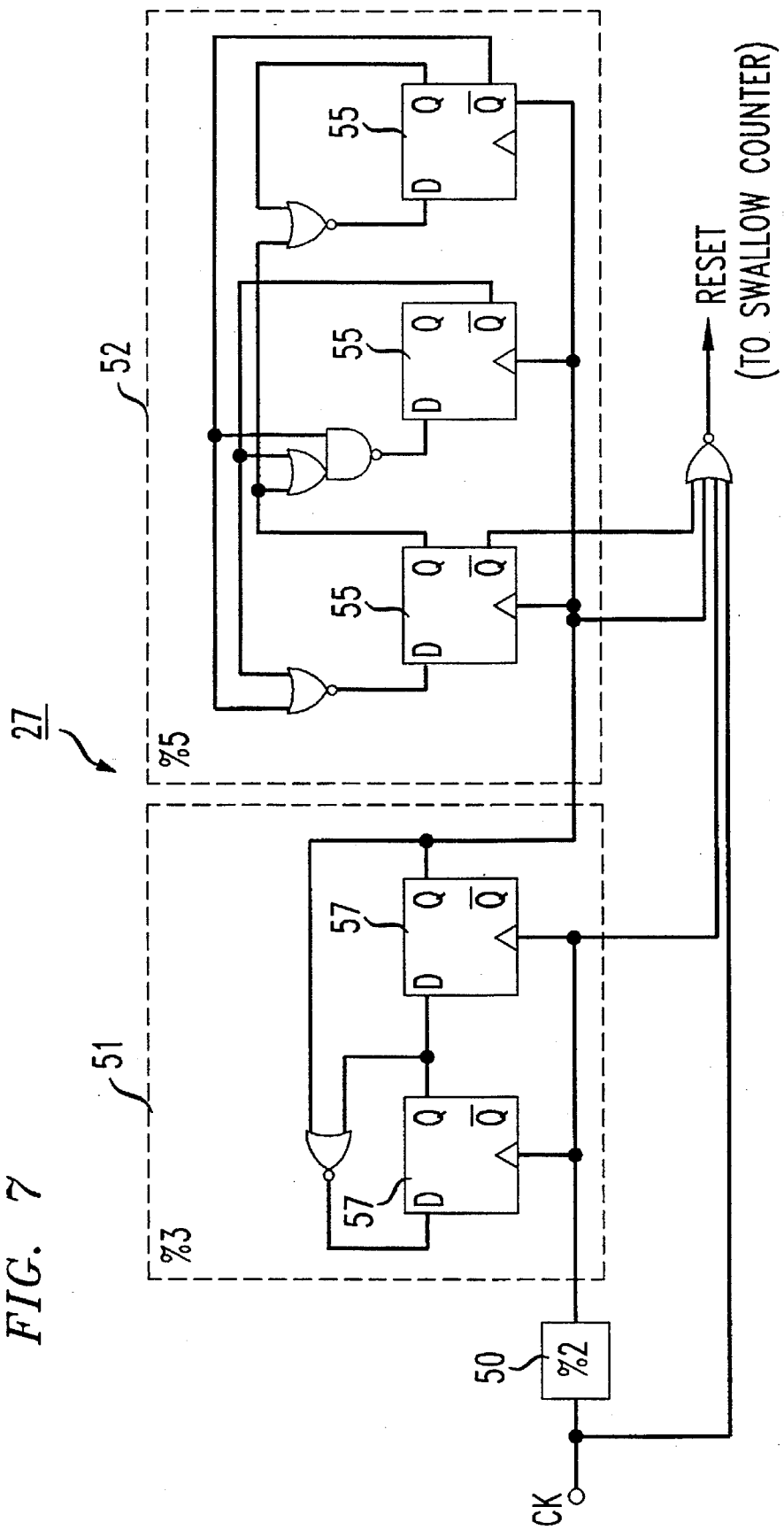
FIG. 7 is a block diagram schematic of the ÷30 program counter used in the second phase-locked loop within the present invention frequency synthesizer.

Referring to FIG. 7, a preferred embodiment of the ÷30 modulus program counter 27 is shown that is used in the second pulse-swallow phase-locked loop 14 (FIG. 1). The program counter 27 has a single asynchronous ÷2 circuit 50, a synchronous ÷3 circuit 51, and a synchronous ÷5 circuit 52. The resultant circuit provides ÷(2×3×5), which results in the desired ÷30 modulus. In the program counter 27, the synchronous ÷3 circuit 51 and ÷5 circuit 52 were specifically designed as synchronous circuits to produce a glitch-free RESET pulse for the swallow counter 24 (FIG. 5). In the preferred embodiment, the ÷5 circuit 52 contains three D flip-flops 55, while the ÷3 circuit 51 contains two D Flip-flops 57. All of the D flip-flops are of the same structure as those used within the prescaler 22 (FIG. 4) and the other program counter. Accordingly, the complexity overall circuit is greatly reduced as are the manufacturing cost associated with manufacturing the overall circuit. It will be understood that the structure of ÷20 program counters and ÷30 program counters are known in the art and any such know circuit can be substituted for the exemplary circuits shown.

Referring back to FIG. 1, it can be seen that in each of the two pulse-swallow phase-locked loops 12, 14, the output of the program counter is mixed with the reference input frequency $f_{REF}$, via a mixer 19. The RESET pulse generated by the program counter is fed back to the swallow counter 24. By using two pulse-swallow phase-locked loops 12, 14, the output frequency generated by the synthesizer circuit 10 can be incremented in steps equal to the difference of the two reference frequencies fed into the two pulse-swallow phase-locked loops 12, 14. Consequently, the feedback within the pulse swallow phase-locked loops 12, 14 is capable of correcting the VCO phase noise outside the loop bandwidth.

To attain a beneficial balance between speed, power and noise immunity, each VCO 20 and dual modulus prescaler 22 utilize differential circuits with I-V swings that operate with rail-to-rail signals. All of the circuits contained within the frequency synthesizer 10 can be fabricated via monolithic integration, such as 0.6 μm CMOS technology. Utilizing 0.6 μm CMOS technology, the present invention frequency synthesizer 10 achieves the goals of reduced phase noise and increased first lock acquisitions of channels while dissipating less than 30 MW from a 3 V supply.

Although the present invention as described above represents the best mode of the invention for a given application, it should be understood that the embodiments described are merely exemplary. The present invention frequency synthesizer can be modified by a person skilled in the art using functionally equivalent components and circuits. For example, there are many VCO circuits, prescaler circuits, pulse-swallow circuits and program counter circuits that have been described and used in the prior art. Many such prior art circuits can be substituted for the preferred embodiment of these circuits illustrated and described herein. All such modifications and alternate embodiments are intended to be included within the scope of the present invention as defined by the appended claims.

What is claimed is:

1. A frequency synthesizer capable of selectively switching between an initial frequency and a subsequent frequency separated by an incremental difference, comprising:

a first phase-locked loop wherein said first phase-locked loop receives a first reference frequency and produces a first output frequency that is a function of said first reference frequency;

a second phase-locked loop wherein said second phase-locked loop receives a second reference frequency and provides a second output frequency that is a function of said second reference frequency; and a mixer for mixing said first output frequency and said second output frequency to produce said subsequent frequency, wherein said subsequent frequency is a function of both said first reference frequency and said second reference frequency, and said incremental difference between said initial frequency and said subsequent frequency is equal to a difference between said first reference frequency and said second reference frequency.

2. The frequency synthesizer according to claim 1 further including a high pass filter coupled to said mixer for filtering said subsequent frequency.

3. The frequency synthesizer according to claim 1 wherein said first phase-locked loop and said second phase-locked loop both include a voltage controlled oscillator, a prescaler, a swallow counter and a program counter.

4. The frequency synthesizer according to claim 3 wherein said program counter in said first phase-locked loop includes a first value divider circuit and said program counter in said second phase-locked loop includes a second value divider circuit, wherein first value divider circuit and said second value divider circuit are not equivalent.

5. The frequency synthesizer according to claim 4 wherein said first value divider circuit is a ÷20 circuit and said second value divider circuit is a ÷30 circuit.

6. The frequency synthesizer according to claim 3 wherein each said program counter includes at least one synchronous divider and at least one asynchronous divider circuit, wherein said synchronous divider circuit produces a reset signal read by said pulse swallow circuit.

7. The frequency synthesizer according to claim 3 wherein said voltage controlled oscillator is a four stage ring oscillator.

8. The frequency synthesizer according to claim 7 wherein each stage in said four stage ring oscillator produces at least one signal that is 180 degrees out of phase with another signal produced by said four stage oscillator so as to produce first order cancellation.

9. The frequency synthesizer according to claim 7 wherein each stage of said four stage ring oscillator includes an NMOS transistor differential pair that are biased at a tail current of approximately 0.75 mA.

10. The frequency synthesizer according to claim 7 wherein said voltage controlled oscillator further includes a positive/negative feedback circuit, wherein as a feedback from said positive/negative feedback circuit goes from positive to negative the impedance associated with each port of said voltage controlled oscillator decreases, thereby increasing oscillation rate.

11. The frequency synthesizer according to claim 1, wherein said first phase-locked loop produces said first output frequency and said second phase-locked loop produces said second output frequency, simultaneously.

12. The frequency synthesizer according to claim 1, wherein a first incremental difference exists between said first reference frequency and said first output frequency, and a second incremental difference exists between said second reference frequency and said second output frequency, wherein said first incremental difference is not equal to said second incremental difference.

13. A frequency synthesizer capable of selectively switching between an initial frequency and a subsequent frequency separated by a multiple of a base incremental difference, comprising;

a first phase-lock loop that receives a first reference frequency;

at least one second phase-lock loop that receives a second reference frequency; and a mixer for mixing the output associated with said first phase-locked loop and said second phase-locked loop to produce said subsequent frequency, wherein said base incremental difference is equal to a difference between said first reference frequency and said second reference frequency.

14. The frequency synthesizer according to claim 13, wherein said first phase-locked loop and said at least one second phase-locked loop each includes a voltage controlled oscillator and a feedback loop that includes a dual modulus prescaler, a program counter and a pulse swallow counter, arranged as a pulse swallow.

15. The frequency synthesizer according to claim 14 wherein said voltage controlled oscillator is a four stage ring oscillator.

16. The frequency synthesizer according to claim 13 wherein said frequency synthesizer receives input frequency ($f0$) and said frequency synthesizer produces said subsequent frequency (fout) wherein $fout=2f0 \div k(frefl-fref2)$. k is a value that is dependent upon the number of signal channels, frefl is said first reference frequency and fref2 is said second reference frequency.

17. The frequency synthesizer according to claim 15, wherein said voltage controlled oscillator further includes a means for providing positive and negative feedback, wherein the impedance at each port associated with the voltage controlled oscillator decreases as the feedback changes from positive to negative.

18. The frequency synthesizer according to claim 14 wherein said program counter in said first phase-locked loop includes a first value divider circuit and each said program counter in said at least one phase-locked loop includes a second value divider, wherein said first value divider circuit and each said second value divider circuit are not equivalent.

19. The frequency synthesizer according to claim 15 wherein each stage of said four stage ring oscillator includes a differential pair of NMOS transistors with PMOS loads.

20. The frequency synthesizer according to claim 17 wherein said means for producing positive and negative feedback include the use of a plurality of differential transistor pairs within said voltage controlled oscillator.

21. The frequency synthesizer according to claim 14 wherein said voltage controlled oscillator and said dual modulus prescaler are differential circuits.

22. The frequency synthesizer according to claim 14 wherein said dual modulus prescaler divides an input frequency by a predetermined number (N) when said input frequency has a high modulus, and divides said input frequency by said predetermined number minus one (N−1) when said input frequency has a low modulus.

23. The frequency synthesizer according to claim 13, wherein said first phase-locked loop produces said first output frequency and said second phase-locked loop produces said second output frequency, simultaneously.

24. The frequency synthesizer according to claim 13, wherein a first incremental difference exists between said first reference frequency and said first output frequency, and a second incremental difference exists between said second reference frequency and said second output frequency, wherein said first incremental difference is not equal to said second incremental difference.

* * * * *